(12) United States Patent
Bertness et al.

(10) Patent No.: US 6,329,793 B1
(45) Date of Patent: *Dec. 11, 2001

(54) METHOD AND APPARATUS FOR CHARGING A BATTERY

(75) Inventors: Kevin I. Bertness, Batavia; Stephen J. McShane, Oak Brook, both of IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/577,421

(22) Filed: May 22, 2000

Related U.S. Application Data

(60) Continuation-in-part of application No. 08/962,754, filed on Nov. 3, 1997, now Pat. No. 6,081,098, and a continuation-in-part of application No. 09/426,302, filed on Oct. 25, 1999, now Pat. No. 6,091,245, which is a division of application No. 08/681,730, filed on Jul. 29, 1996, now Pat. No. 6,051,976.

(51) Int. Cl.[7] .............................. H02J 7/00; H01M 10/44; G01N 27/416
(52) U.S. Cl. .................... 320/132; 320/134; 324/430; 324/433
(58) Field of Search ................................. 320/132, 134; 324/427, 430, 433

(56) References Cited

U.S. PATENT DOCUMENTS

| 2,514,745 | 7/1950 | Dalzell | 171/95 |
|---|---|---|---|
| 3,356,936 | 12/1967 | Smith | 324/29.5 |
| 3,562,634 | 2/1971 | Latner | 31/4 |

(List continued on next page.)

FOREIGN PATENT DOCUMENTS

| 0 022 450 A1 | 1/1981 | (EP) . |
|---|---|---|
| 29 26 716 B1 | 1/1981 | (DE) . |
| 0 637 754 A1 | 2/1995 | (EP) . |
| 0 772 056 A1 | 5/1997 | (EP) . |

(List continued on next page.)

OTHER PUBLICATIONS

"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sep. 1959, pp. 922–925.
"Determining The End of Battery Life", by S. DeBardelaben, *IEEE*, 1986, pp. 365–368.
"A Look at the Impedance of a Cell", by S. Debardelaben, *IEEE*, 1988, pp. 394–397.
"The Impedance of Electrical Storage Cells", by N.A. Hampson et al., *Journal of Applied Electrochemistry*, 1980, pp. 3–11.
"A Package for Impedance/Admittance Data Analysis", by B. Boukamp, *Solid State Ionics*, 1986, pp. 136–140.
"Precision of Impedance Spectroscopy Estimates of Bulk, Reaction Rate, and Diffusion Parameters", by J. Macdonald et al., *J. Electroanal, Chem.*, 1991, pp. 1–11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

(List continued on next page.)

*Primary Examiner*—Gregory J. Toatley, Jr.
(74) *Attorney, Agent, or Firm*—Westman, Champlin & Kelly, P.A.

(57) ABSTRACT

An apparatus for charging a battery, includes a first electrical connector configured to couple to a positive terminal of the battery and a second electrical connector configured to couple to a negative terminal of the battery. The first and second connectors are used to charge the battery. A microprocessor is configured to test the battery and provide an encrypted output related to the battery test.

78 Claims, 9 Drawing Sheets

U.S. PATENT DOCUMENTS

| | | | |
|---|---|---|---|
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,876,931 | 4/1975 | Godshalk | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/61 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,659,977 | 4/1987 | Kissel et al. | 320/64 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,913,116 | 4/1990 | Katogi et al. | 123/425 |
| 4,929,931 | 5/1990 | McCuen | 340/636 |
| 4,931,738 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavvvvey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,160,881 | 11/1992 | Schramm et al. | 322/7 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,331,268 | 7/1994 | Patino et al. | 320/20 |
| 5,336,993 | 8/1994 | Thomas et al. | 324/158.1 |
| 5,338,515 | 8/1994 | Dalla Betta et al. | 422/95 |
| 5,339,018 | 8/1994 | Brokaw | 320/35 |
| 5,343,380 | 8/1994 | Champlin | 363/46 |
| 5,347,163 | 9/1994 | Yoshimura | 307/66 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,412,323 | 5/1995 | Kato et al. | 324/429 |
| 5,426,371 | 6/1995 | Salley et al. | 324/429 |
| 5,426,416 | 6/1995 | Jefferies et al. | 340/664 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,537,967 | 7/1996 | Tashiro et al. | 123/792.1 |
| 5,546,317 | 8/1996 | Andrieu | 364/481 |
| 5,548,273 | 8/1996 | Nicol et al. | 340/439 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |

| | | | | | | | |
|---|---|---|---|---|---|---|---|
| 5,650,937 | 7/1997 | Bounaga | 364/483 | 6,172,483 | 1/2001 | Champlin | 320/134 |
| 5,652,501 | 7/1997 | McClure et al. | 320/17 | 6,172,505 | 1/2001 | Bertness | 324/430 |
| 5,656,920 | 8/1997 | Cherng et al. | 320/31 | | | | |
| 5,675,234 | 10/1997 | Greene | 320/15 | | | | |
| 5,677,077 | 10/1997 | Faulk | 429/90 | | | | |
| 5,699,050 | 12/1997 | Kanazawa | 340/636 | | | | |
| 5,701,089 | 12/1997 | Perkins | 327/772 | | | | |
| 5,705,929 | 1/1998 | Caravello et al. | 324/430 | | | | |
| 5,710,503 | 1/1998 | Sideris et al. | 320/6 | | | | |
| 5,717,336 | 2/1998 | Basell et al. | 324/430 | | | | |
| 5,717,937 | 2/1998 | Fritz | 395/750.01 | | | | |
| 5,747,909 | 5/1998 | Syverson et al. | 310/156 | | | | |
| 5,757,192 | 5/1998 | McShane et al. | 324/427 | | | | |
| 5,760,587 | 6/1998 | Harvey | 324/434 | | | | |
| 5,773,978 | 6/1998 | Becker | 324/430 | | | | |
| 5,789,899 | 8/1998 | van Phuoc et al. | 320/30 | | | | |
| 5,793,359 | 8/1998 | Ushikubo | 345/169 | | | | |
| 5,808,469 | 9/1998 | Kopera | 324/43.4 | | | | |
| 5,821,756 | 10/1998 | McShane et al. | 324/430 | | | | |
| 5,825,174 | 10/1998 | Parker | 324/106 | | | | |
| 5,831,435 | 11/1998 | Troy | 324/426 | | | | |
| 5,862,515 | 1/1999 | Kobayashi et al. | 702/63 | | | | |
| 5,872,443 | 2/1999 | Williamson | 320/21 | | | | |
| 5,895,440 | 4/1999 | Proctor et al. | 702/63 | | | | |
| 5,914,605 | 6/1999 | Bertness | 324/430 | | | | |
| 5,929,609 | 7/1999 | Joy et al. | 322/25 | | | | |
| 5,939,855 | 8/1999 | Proctor et al. | 320/104 | | | | |
| 5,939,861 | 8/1999 | Joko et al. | 320/122 | | | | |
| 5,945,829 | 8/1999 | Bertness | 324/430 | | | | |
| 6,002,238 | 12/1999 | Champlin | 320/134 | | | | |
| 6,008,652 | 12/1999 | Theofanopoulos et al. | 324/434 | | | | |
| 6,009,369 | 12/1999 | Boisvert et al. | 701/99 | | | | |
| 6,031,354 | 2/2000 | Wiley et al. | 320/116 | | | | |
| 6,037,751 | 3/2000 | Klang | 320/160 | | | | |
| 6,037,777 | 3/2000 | Champlin | 324/430 | | | | |
| 6,051,976 | 4/2000 | Bertness | 324/426 | | | | |
| 6,072,299 | 6/2000 | Kurie et al. | 320/112 | | | | |
| 6,072,300 | 6/2000 | Tsuji | 320/116 | | | | |
| 6,081,098 | 6/2000 | Bertness et al. | 320/134 | | | | |
| 6,091,245 | 7/2000 | Bertness | 324/426 | | | | |
| 6,094,033 | 7/2000 | Ding et al. | 320/132 | | | | |
| 6,104,167 | 8/2000 | Bertness et al. | 320/132 | | | | |
| 6,114,834 * | 9/2000 | Parise | 320/109 | | | | |
| 6,137,269 | 10/2000 | Champlin | 320/150 | | | | |
| 6,150,793 | 11/2000 | Lesesky et al. | 320/104 | | | | |
| 6,163,156 | 12/2000 | Bertness | 324/426 | | | | |

FOREIGN PATENT DOCUMENTS

| | | |
|---|---|---|
| 2 749 397 | 12/1997 | (FR) . |
| 2 088 159 A | 6/1982 | (GB) . |
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 59215674 | 12/1984 | (JP) . |
| 60225078 | 11/1985 | (JP) . |
| 62-180284 | 8/1987 | (JP) . |
| 03274479 | 12/1991 | (JP) . |
| 03282276 | 12/1991 | (JP) . |
| 4-8636 | 1/1992 | (JP) . |
| 04131779 | 5/1992 | (JP) . |
| 04372536 | 12/1992 | (JP) . |
| 521655 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

IEEE Recommended Practice For Maintenance, Testings, and Replacement of Large Lead Storage Batteries for Generating Stations and Substations, The Institute of Electrical and Electronics Engineers, Inc., *ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE,* Aug. 1992, pp. 218–233.

"JIS Japanese Industrial Standard—Lead Acid Batteries for Automobiles", *Japanese Standards Association UDC,* 621.355.2:629.113.006, Nov. 1995.

"Performance of Dry Cells", by C. Hambuechen, Preprint of *Am. Electrochem. Soc.,* Apr. 18–20, 1912, paper No. 19, pp. 1–5.

"A Bridge for Measuring Storage Battery Resistance", by E. Willihncanz, *The Electrochemical Society,* preprint 79–20, Apr. 1941, pp. 253–258.

* cited by examiner

METHOD AND APPARATUS FOR CHARGING A BATTERY

This application is a C-I-P of U.S. patent application Ser. No. 08/962,754, filed Nov. 3, 1997 now U.S. Pat. No. 6,081,098 and U.S. patent application Ser. No. 09/426,302, now U.S. Pat. No. 6,091,245 filed Oct. 25, 1999, which is a Divisional of U.S. patent application Ser. No. 08/681,730 now U.S. Pat. No. 6,051,976, filed Jul. 29, 1996.

BACKGROUND OF THE INVENTION

The present invention relates to rechargeable storage batteries. More specifically, the present invention relates to battery chargers of the type used to charge such batteries.

Chemical batteries which create electricity from chemical reactions have been known for many years. Such batteries are becoming increasing important and have found uses throughout industry. These uses include automobiles, UPS systems, etc.

One advantage of chemical batteries, such as lead acid storage batteries, is that they can be charged and their chemical process reversed by forcing electricity through the battery. Charging systems are widely known in the art and are widely available in the consumer market.

One of the most common techniques for recharging storage batteries is simply placing a voltage source across the battery having a voltage which is greater than the battery voltage. The voltage difference will cause a charging current to flow through the battery causing a reversal of the chemical reaction. The charging current decreases as the voltage difference between the charging voltage and the battery voltage decreases. Typically, the charging voltage is selected to be greater than the nominal battery voltage in order to cause a slight overcharge of the battery. The battery is deemed to be "charged" when the battery will accept no additional current. Frequently, this is through a simple visual inspection of an amp meter on the battery charger by the user of the battery charger. The battery charger may then be switched off.

However, such a simple technique for recharging a battery, although inexpensive, does not provide optimum battery charging and provides very little information about the battery itself. The device does not permit optimal rapid charging of the battery and may lead to excessive overcharging of the battery that can permanently damage the battery and even lead to boiling of the battery electrochemicals causing an unsafe environment. On the other hand, undercharging of a battery results in a battery that is not capable of providing its full potential output. These problems are exacerbated in situations where the battery is rapidly charged using large charging currents.

U.S. Pat. No. 4,956,597, issued Sep. 11, 1990 to Heavey et al. and is assigned to American Monarch Corporation, and entitled "METHOD AND APPARATUS FOR CHARGING BATTERIES" describes one technique in which battery voltage is monitored in an attempt to determine when a battery is fully charged. Another example is shown in U.S. Pat. No. 5,642,031, entitled BATTERY RECHARGING SYSTEM WITH STATE OF CHARGE DETECTION THAT INITIALLY DETECTS WHETHER A BATTERY TO BE CHARGED IS ALREADY AT OR NEAR FULL CHARGE TO PREVENT OVERCHARGING, issued Jun. 24, 1997 to Brotto. The Brotto patent describes a technique in which the charging current is periodically pulsed and the voltage decay is monitored.

SUMMARY OF THE INVENTION

An apparatus for charging a battery, includes a first electrical connector configured to couple to a positive terminal of the battery and a second electrical connector configured to couple to a negative terminal of the battery. The first and second connectors are used to charge the battery. A microprocessor is configured to test the battery and provide an encrypted output related to the battery test.

DETAILED DESCRIPTION OF THE PREFERRED EMBODIMENTS

The present invention provides an apparatus for charging a battery which is also capable of monitoring the condition of the battery. Such monitoring can be used to provide information to an operator, or to provide feedback to control the charging. The invention can use the charging current and voltage themselves to advantageously determine battery condition. Thus, a battery charger in accordance with the present invention is capable of determining the status of the battery, making advanced decisions about charging the battery and selecting a particular charging profile used in such charging.

Figure 1:
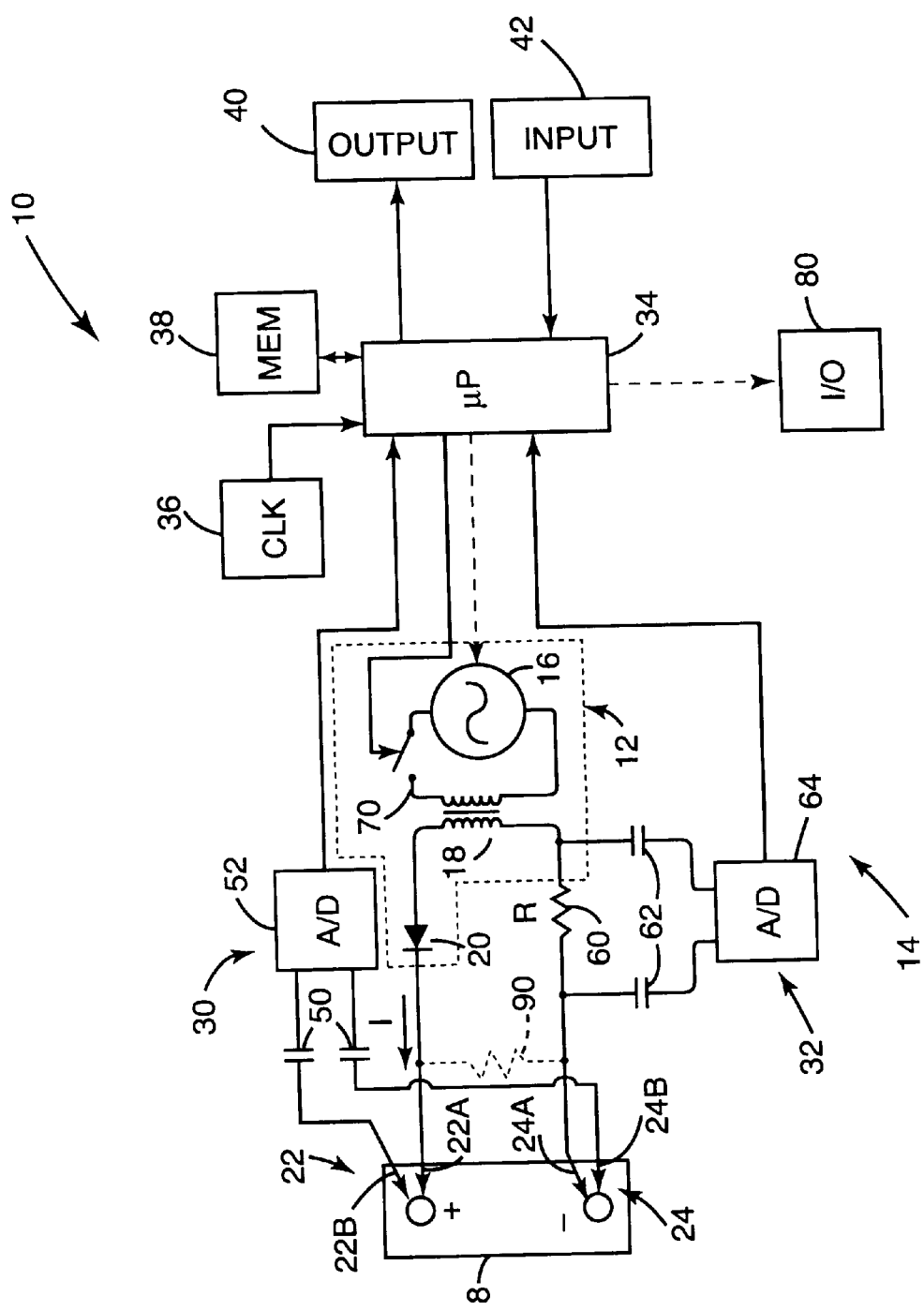
FIG. 1 is a simplified block diagram of a battery charging system in accordance with the present invention.

FIG. 1 is a simplified block diagram of a battery charging system 10 in accordance with the present invention coupled to storage battery 8. Battery 8 is typically a lead-acid storage battery of the type used in automotive vehicles or standby electrical systems. System 10 includes battery charger circuitry and test circuitry 14. Battery charge circuitry 12 generally includes AC source 16, transformer 18 and rectifier 20. System 10 couples to battery 8 through electrical connection 22 which couples to the positive terminal of battery 8 and electrical connection 24 which couples to the negative terminal of battery 8. In one preferred embodiment, a four point (or Kelvin) connection technique is used in which battery charge circuitry 12 couples to battery 8 through electrical connections 22A and 24B while battery testing circuitry 14 couples to battery 8 through electrical connections 22A and 24B.

Battery testing circuitry 14 includes voltage measurement circuitry 30 and current measurement circuitry 32 which provide outputs to microprocessor 34. Microprocessor 34 also couples to a system clock 36 and memory 38 which is used to store information and programming instructions. In the embodiment of the invention shown in FIG. 1, microprocessor 34 also couples to user output circuitry 40 and user input circuitry 42.

Voltage measurement circuitry 34 includes capacitors 50 which couple analog to digital converter 52 to battery 8 through electrical connections 22B and 24B. Any type of coupling mechanism may be used for element 50 and capacitors are merely shown as one preferred embodiment. Further, the device may also couple to DC signals. Current measurement circuitry 32 includes a shunt resistor (R) 60 and coupling capacitors 62. Shunt resistor 60 is coupled in series with battery charging circuitry 12. Other current measurement techniques are within the scope of the invention including Hall-Effect sensors, magnetic or indicative coupling, etc. An analog to digital converter 64 is connected across shunt resistor 60 by capacitor 62 such that the voltage provided to analog to digital converter 64 is proportional to a current I flowing through battery 8 due to charging circuitry 12. Analog to digital converter 64 provides a digitized output representative of this current to microprocessor 34.

During operation, AC source 16 is coupled to battery 8 through transformer 18 and rectifier 20. Rectifier 20 provides half way rectification such that current I has a non-zero DC value. Of course, full wave rectification or other AC sources may also be used. Analog to digital converter 64 provides a digitized output to microprocessor 34 which is representative of current I flowing through battery 8. Similarly, analog to digital converter 52 provides a digitized output representative of the voltage across the positive and negative terminals of battery 8. Analog to digital converters 52 and 64 are capacitively coupled to battery 8 such that they measure the AC components of the charging signal.

Microprocessor 34 determines the conductance of battery 8 based upon the digitized current and voltage information provided by analog to digital converters 64 and 52, respectively. Microprocessor 34 counts the conductance of battery 8 as follows:

$$\text{Conductance} = G = \frac{I}{V}, \quad \text{Eq. 1}$$

where I is the charging current and V is the charging voltage across battery 8. Note that in one preferred embodiment the Kelvin connections allow more accurate voltage determination because these connections do not carry substantial current to cause a resultant drop in the voltage measured.

In accordance with the present invention, the battery conductance is used to monitor charging of battery 8. Specifically, it has been discovered that as a battery is charged the conductance of the battery rises. This rise in conductance can be monitored in microprocessor 34 to determine when the battery has been fully charged. For example, if the rate of the rise in conductance slowly decreases, such that the conductance reaches a substantially constant value, microprocessor 34 determines that battery 8 is fully charged and disconnect charging circuitry 12 using switch 70. Further, in one aspect of the present invention, microprocessor 34 responsively controls the rate of charge by adjusting AC source 16 to reduce the likelihood that battery 8 is damaged by significant overcharge.

Figure 2:
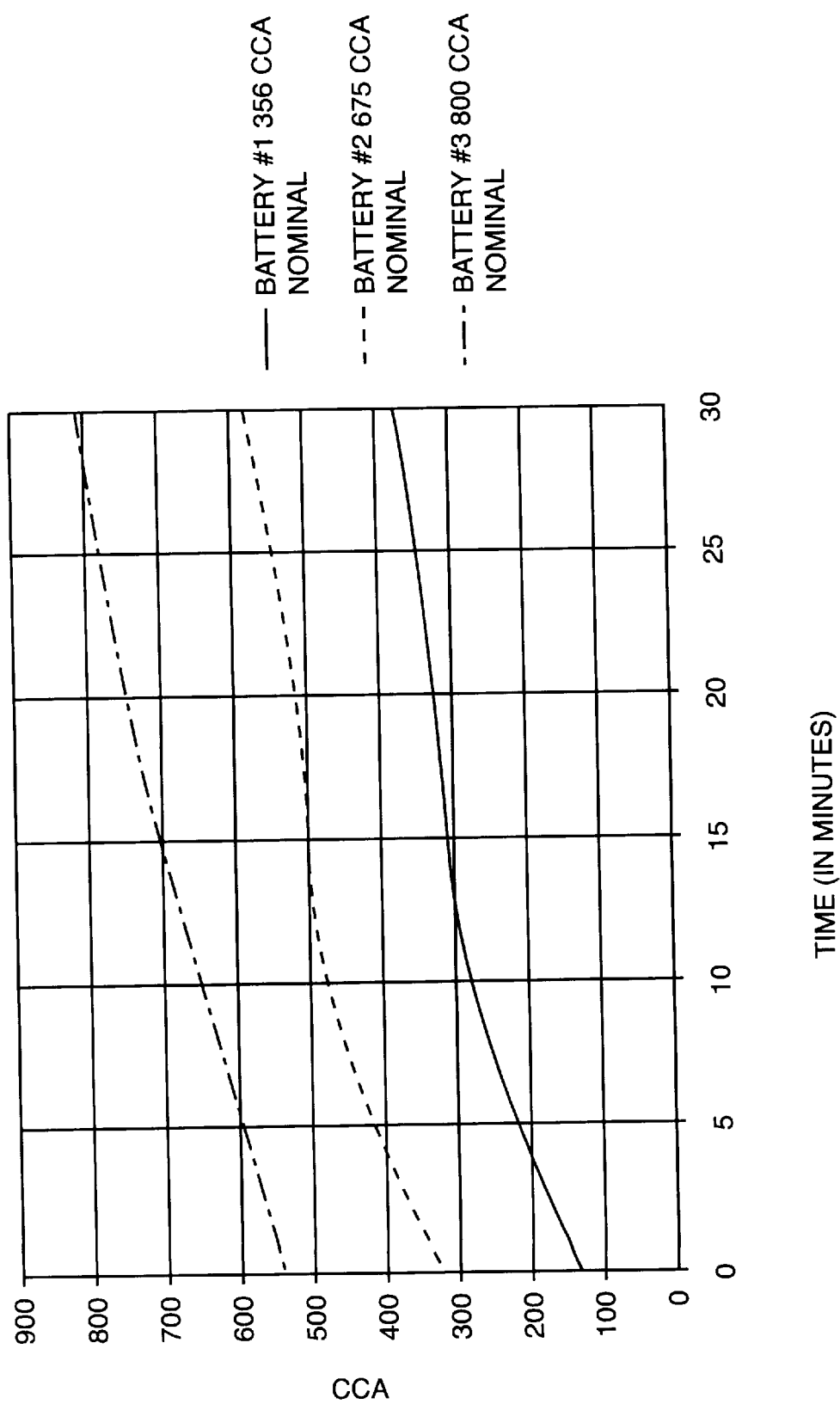
FIG. 2 is a graph of CCA versus time.

Furthermore, microprocessor 34 can calculate cold cranking amps (CCA) of battery 8 using the formula:

$$CCA = K \cdot G \quad \text{Eq. 2}$$

where K is constant which may be selected for a specific battery and G is given in Equation 1. FIG. 2 is a graph of CCA versus time in minutes for three different batteries having three different nominal CCA ratings. This particular graph shows that after about 25 to 30 minutes, each battery has reached its nominal CCA rating.

Figure 3:
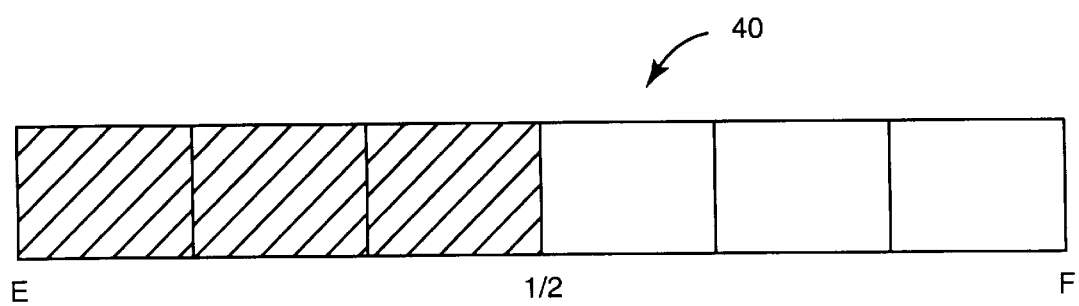
FIG. 3 shows an output display in accordance with one embodiment of the present invention.

One aspect of the invention includes storing information in microprocessor 34 or memory 38 which relates to battery 8. For example, this information could be the battery's nominal CCA rating as input through input 42 by an operator. Further, the make and model of the battery may be input by an operator through input 42 and information related to that specific battery type recovered from memory 38. In general, the rating of the battery may be input in the form of CCA, amp hours, RC, JIS number, stock number, battery construction or chemistry, etc. For example, if a nominal or reference conductance ($G_{REFERENCE}$) is stored in memory, a relative conductance determination can be made by microprocessor 34 using the equation:

$$\text{Relative Conductance}(\%) = \frac{G_{measured}}{G_{reference}} \times 100, \quad \text{Eq. 3}$$

where $G_{measured}$ is the battery conductance in accordance with Equation 1. Generally, this reference conductance is determined based upon type and characteristics of battery 8. This technique is described in U.S. Pat. No. 5,140,269, entitled ELECTRONIC TESTER FOR ASSESSING BATTERY/CELL CAPACITY, issued Aug. 18, 1992 to Champlin. This may be converted into a display for output on output 40 such that an operator may monitor the charging of battery 8. For example, FIG. 3 shows one embodiment of output 40 in which a bar graph is provided with indications for "empty" and "full." In the embodiment shown in FIG. 3, a half reading "full" is shown. This may be implemented through an LED display, for example. Other examples of desirable outputs include outputs which appear as a gauge or other visual indication of the battery condition. Other types of outputs include outputs indicating the recovering of amp hours, state of charge, reserve capacity, time to full charge or run time remaining. This may be shown in percentages, numerically, graphically, etc.

Figure 4:
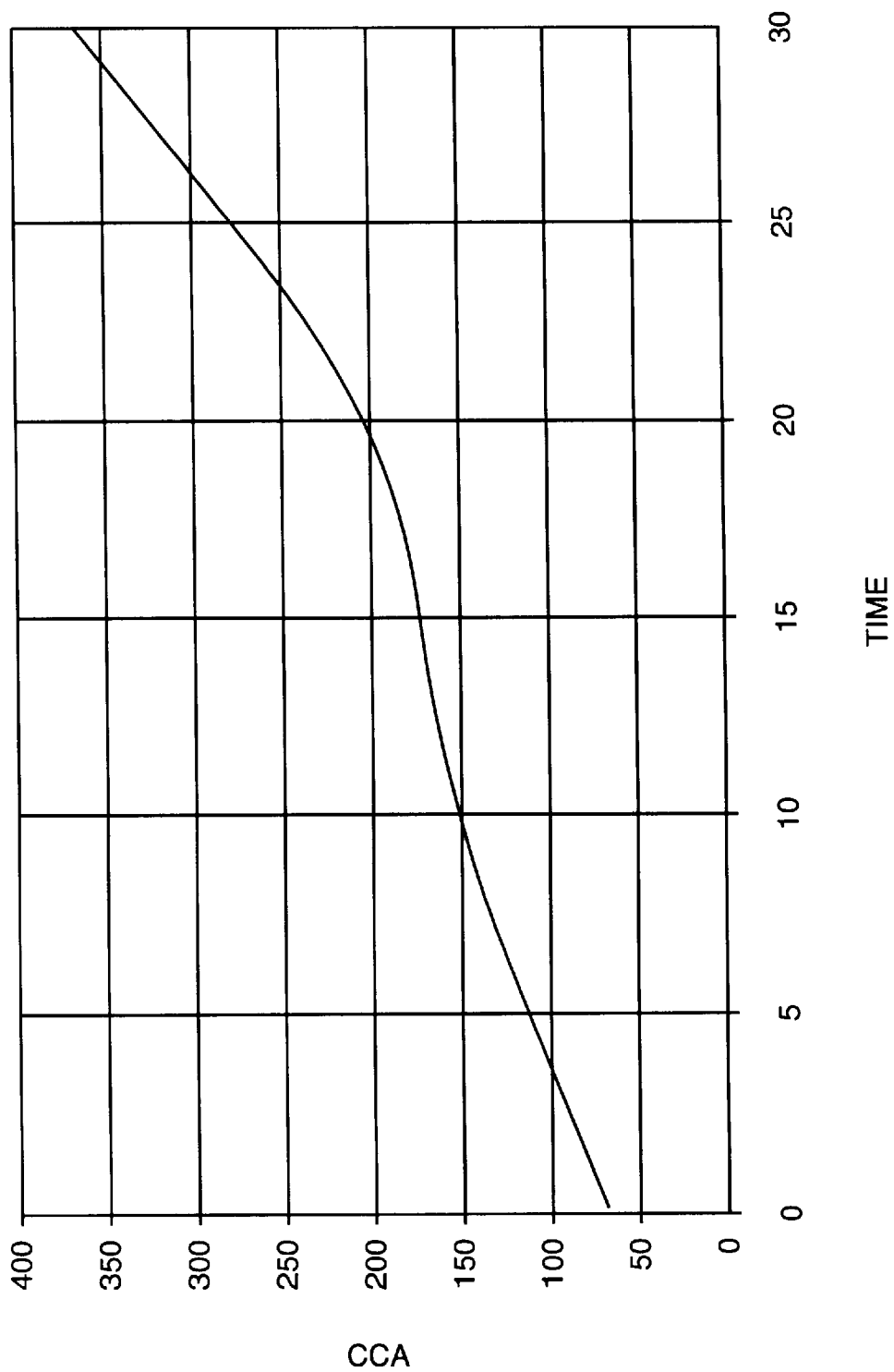
FIG. 4 is a graph of CCA versus time for a battery with a bad cell.
Figure 5:
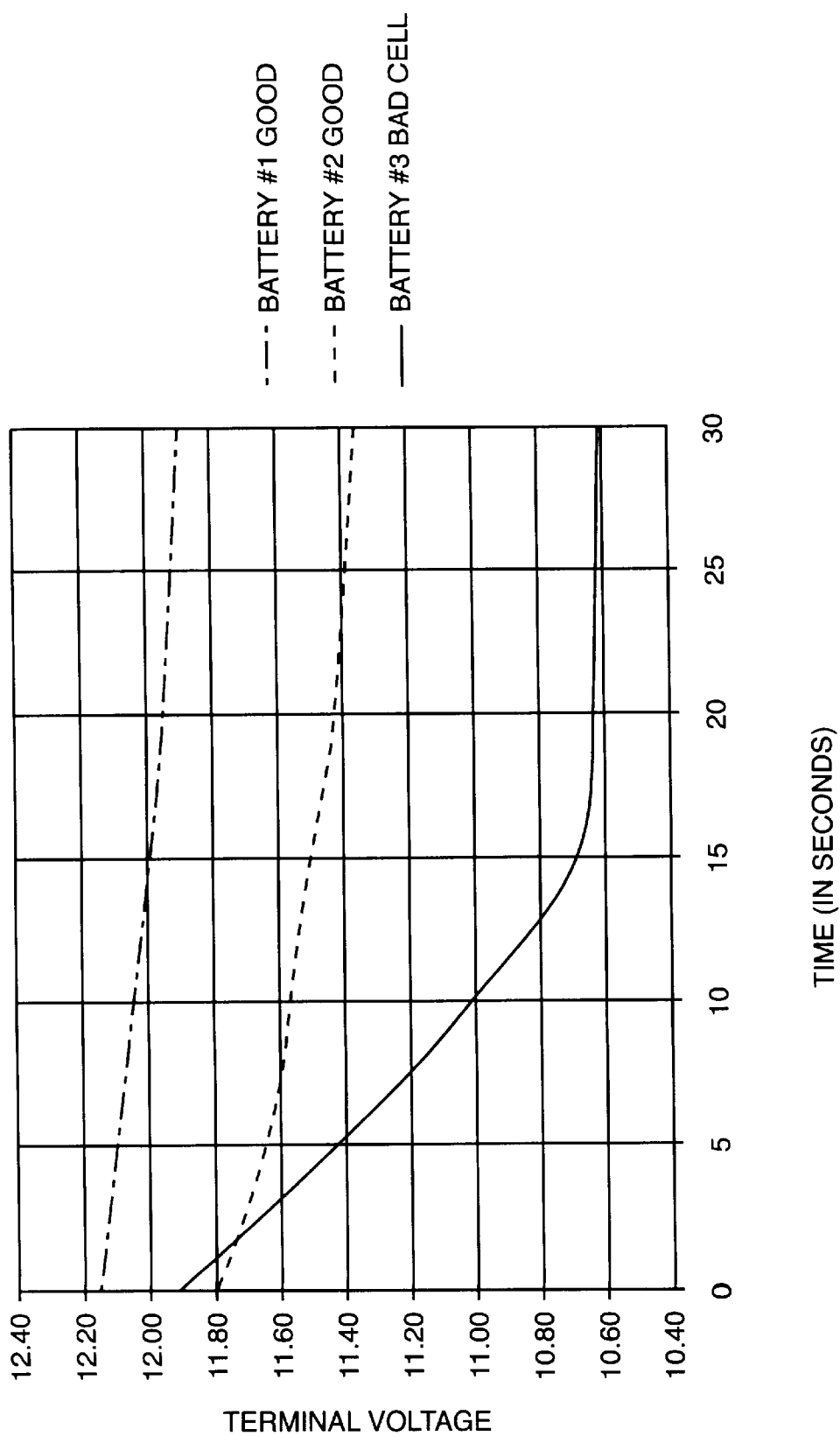
FIG. 5 is a graph of terminal voltage versus time for three batteries under a load test.

One general aspect of the present invention includes a technique for providing feedback control of a battery charger. In one embodiment, bad cells or shorted cells are detected when the rate of change of the conductance is greater than a predetermined threshold. For example, FIG. 4 is a graph of CCA versus time for a battery (nominal conductance of 500 CCA) being charged in accordance with the invention which developed a bad cell during testing. The graph of FIG. 4 shows an abnormal change in conductance in comparison to the graphs of FIG. 2. This can be used to control the charging rate, or to stop the charging rate and give a fault indication using output 40. Further, an initial load test may be applied to the battery using load resistance 90 to determine if there is a bad cell by observing a resultant decline in voltage versus time using voltage measurement circuitry 30. This is illustrated in the graph of FIG. 5 which shows battery terminal voltage versus time for two good batteries and one battery with a bad cell. Further, other diagnostics may be performed such as those described in U.S. Pat. No. 5,574,355, entitled METHOD AND APPARATUS FOR DETECTION AND CONTROL OF THERMAL RUNAWAY IN A BATTERY UNDER CHARGE, issued Nov. 12, 1996 to McShane et al.

The present invention can advantageously use the charging current and voltage to determine the condition of the battery. This allows for continuous testing during battery charging and the battery charger does not need to be taken off line. Further, the measurement is not adversely affected by electrical noise in the system.

Figure 6:
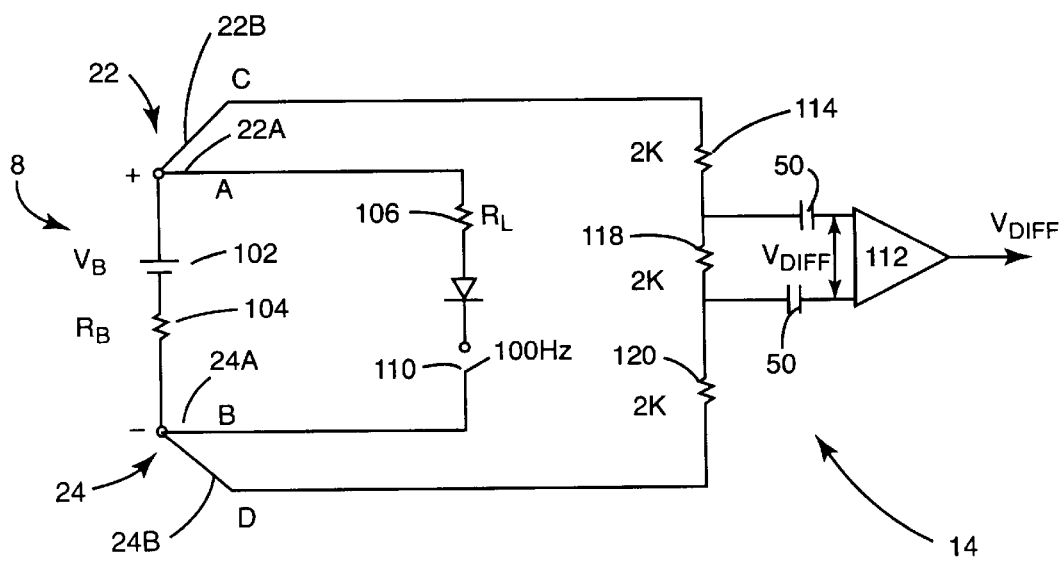
FIG. 6 is a simplified schematic diagram showing battery test circuitry for use in the charger of the present invention.

FIG. 6 is a simplified schematic diagram which illustrates another example battery test circuitry 14 for use with the battery charger of FIG. 1 having Kelvin connections in accordance with the invention. In FIG. 6, battery 8 is illustrated as a voltage source $V_B$ 102 and as the internal battery resistance $R_B$ 104. A resistive load $R_L$ 106 is a periodically coupled across battery 8 using switch 110 to provide an applied AC signal. In general, any signal or "forcing function" can be used which has an C component. Resistance 106 can be, for example, 4.7 ohms and switch 110 can be a field effect transistor. In the example shown, switch 110 operates at a rate of 100 Hz. A differential amplifier 112 is connected across Kelvin connections 22B and 24B through a resistance network formed by resistors 114, 116 and 118 which are, for example, 2 K ohm resistors. Amplifier 112 provides voltage measurement circuitry 30 of FIG. 1. In FIG. 1, differential amplifier 112 is included in analog to digital converter 52.

In operation, microprocessor 34 can disconnect source 16 from battery 8 using the switch 70 and perform a battery test using battery test circuitry such as circuitry 100 shown in FIG. 6. However, if appropriate signal levels and frequencies are used, source 16 can remain connected during a battery test. Microprocessor 34 measures a dynamic parameter of battery 8 using the applied AC forcing function such as the AC signal generated by switch 110 and the resultant voltage change measured by differential amplifier 112. A dynamic parameter can be any parameter of the battery which is a function of an applied signal having an AC component. Microprocessor 34 uses the measured differential voltage to determine the conductance of battery 8 which is the reciprocal of the battery resistance $R_B$ 104. As set forth above in Equation 2, the battery conductance is related to the cold and cranking amps of the battery 8.

Figure 7A:
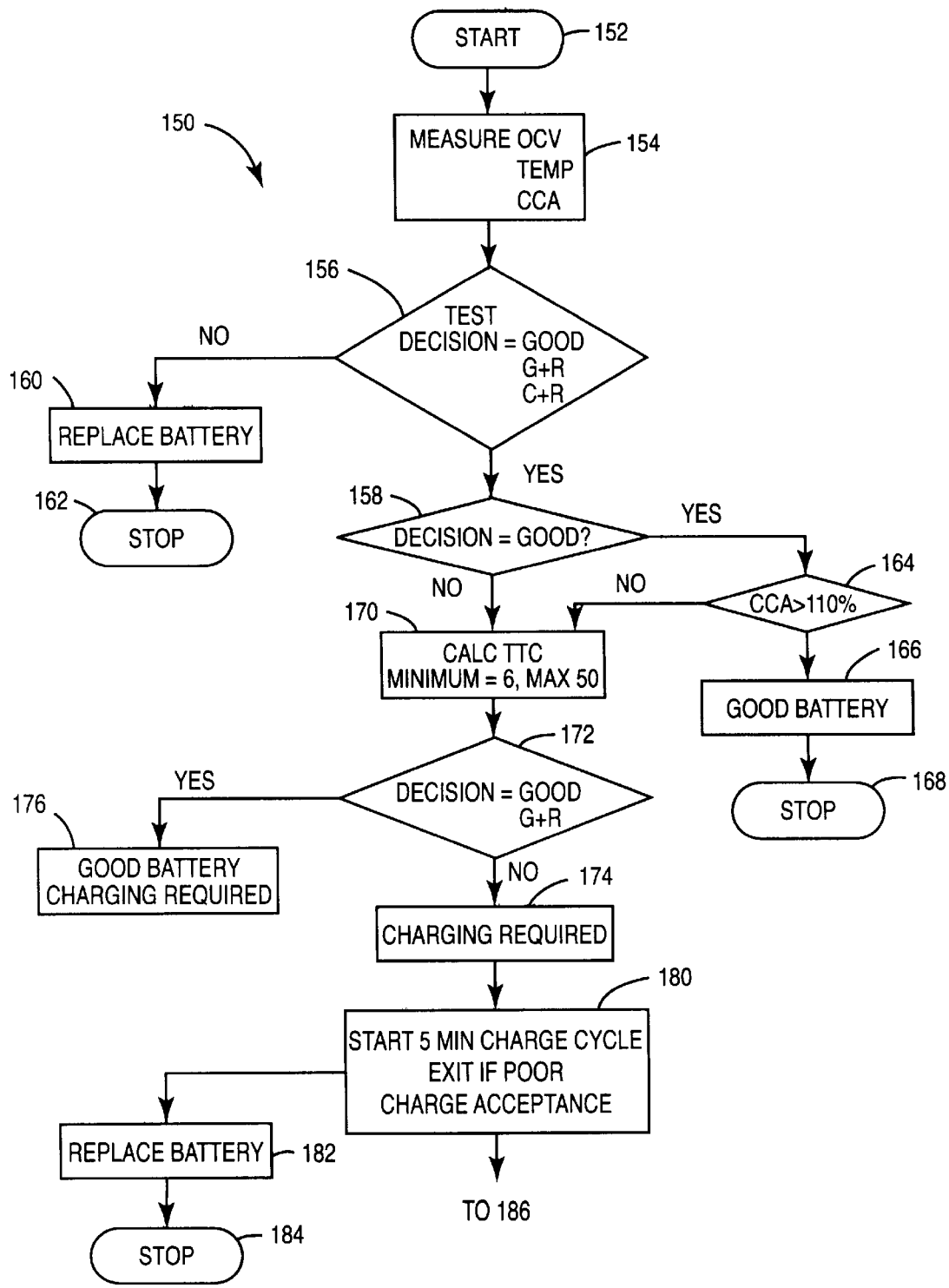
FIGS. 7A, 7B and 7C show a simplified block diagram of steps performed by a battery charger in accordance with one aspect of the invention.
Figure 7B:
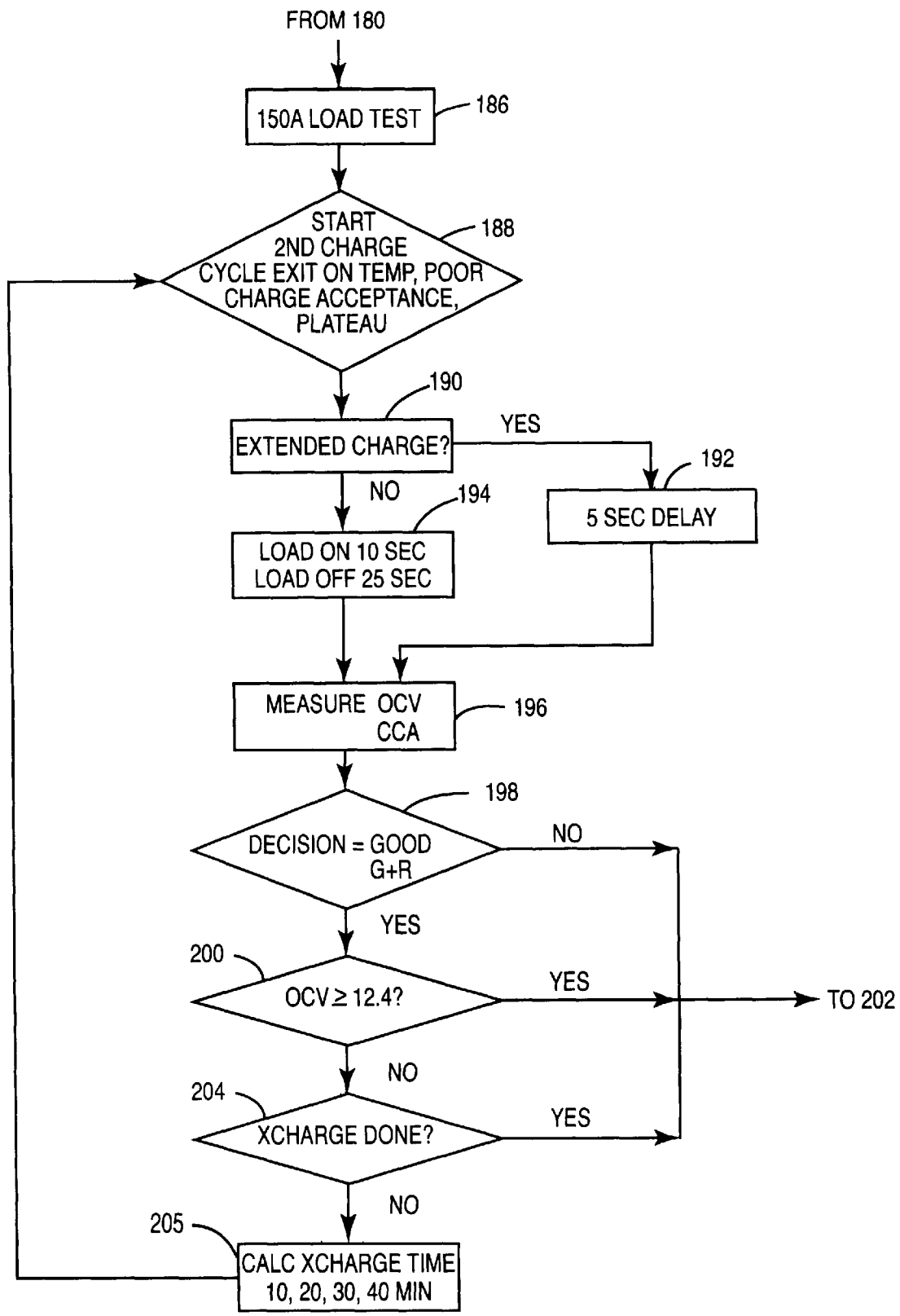
Figure 7C:
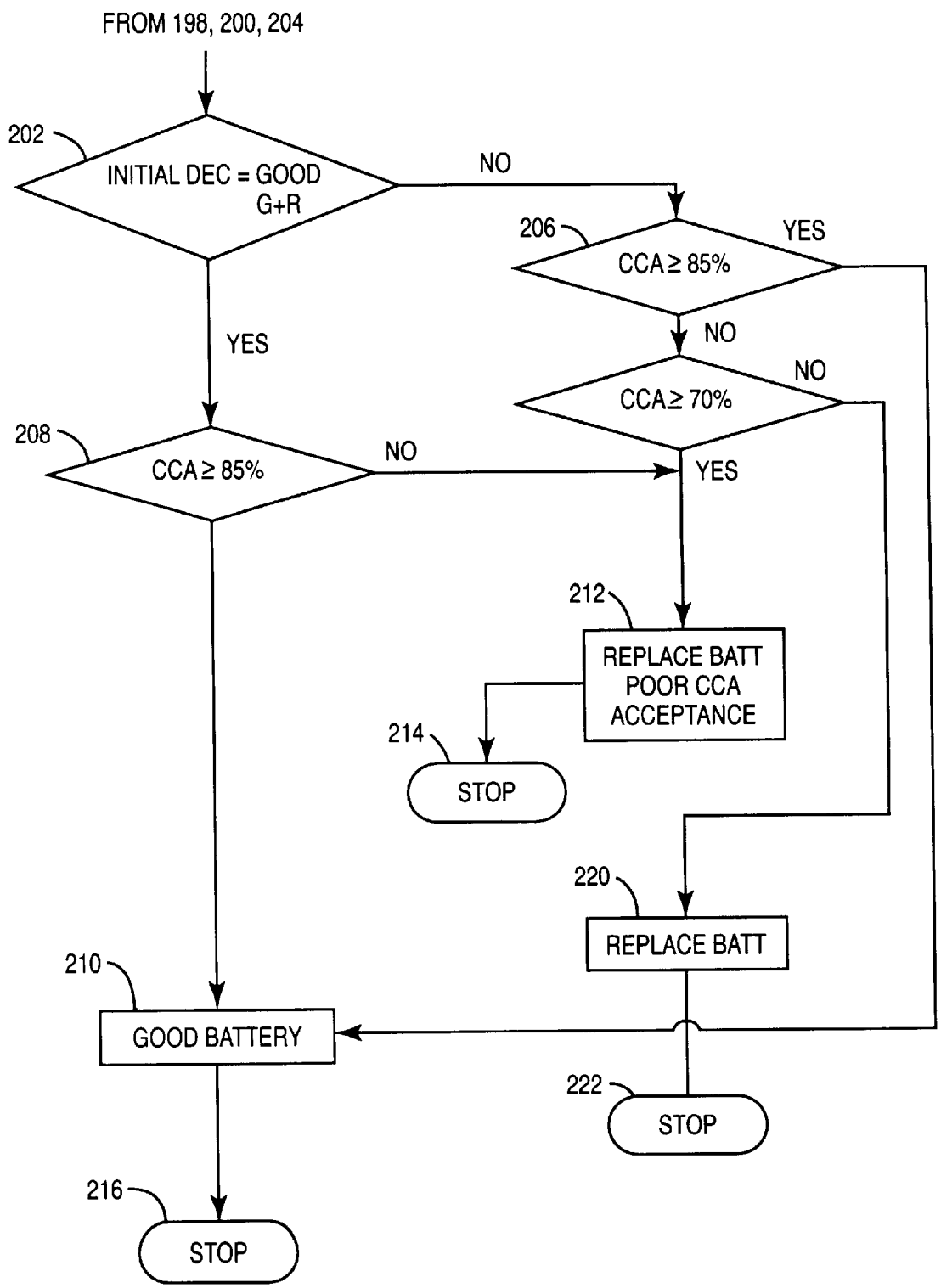

FIGS. 7A, 7B and 7C are block diagrams showing steps performed by a battery charger in accordance with one aspect of the invention. The steps set forth in FIGS. 7A–C can be implemented, for example, in microprocessor 34 and stored as programming instructions in memory 38 of FIG. 1. Block diagram 150 begins at start block 152. At block 154, microprocessor 34 measures the open circuit voltage of battery 8, the temperature, and performs a battery test on battery 8 to determine the CCA of the battery. The temperature can be measured, for example, using a temperature sensor such as sensor 100 in FIG. 1 coupled to microprocessor 34. Preferably, the temperature is of battery 8 and a relatively accurate reading can be obtained if temperature sensor 100 is carried in one of the Kelvin connections 22 or 24.

At block 156, a test decision is made based upon the results of the measurements obtained at block 154. If a decision is made that the battery is good, that the battery is good and should be recharged or that the battery is good and should be retested, control is passed to block 158. However, if the battery tests bad, control is passed to block 160 and "replace battery" is displayed to inform an operator that the battery should be replaced. Any battery tester criteria can be used at block 156. The procedure stops at block 162. At block 158 if the battery tested good, control is passed to block 164. At block 164, if the measured CCA of the battery is greater than 110% of the rated CCA, an indication is provided that the battery is good at block 166. This step is performed if the tester determines that the battery is good and does not need any charging. Of course, other rating criteria could be used. The procedure stops at block 168. Alternatively, control is passed to block 170 and the microprocessor 34 calculates the expected to time to charge (TTC) the battery. In one embodiment, the time to charge a battery ranges from six minutes to 50 minutes and is selected based upon the relative conductance of the battery in accordance with a look up table stored in memory 30. However, other techniques can be used to estimate the time required to charge the battery. Complex techniques such as the use of a neural network, fuzzy logic or modeling techniques can also be used.

At block 172, if the battery test result was that the battery was good or good and should be recharged, control is passed to block 176 and an indication is displayed for the operator that the battery is good and charging is required. However, if the battery test result is that the battery should be charged and retested, control is passed to block 174 and an indication is provided that charging is required and no indication is given as to whether the battery is good. Both block 174 and 176 pass control to block 180.

At block 180, microprocessor 34 initiates a charge cycle, for example for 5 minutes. If the battery is not accepting charge, control is passed to block 182 and the operator is instructed to replace the battery. The procedure stops at block 184. Following successful completion of the start duration charge cycle, a load test is applied at block 186 by drawing 150 amps, for example, from the battery 8. At block 188, a second charge cycle is terminated upon a number of conditions. If the battery temperature exceeds maximum or minimum acceptable values, if the battery does not accept a sufficient amount of charge, if the charging plateaus or if the relative CCA is greater than 110%, control is passed to block 190. Additionally, the charging terminates after the battery has been charged for the time to charge as predicted in block 170. In one embodiment, at block 188, a CCA measurement of the battery is made, for example by measuring the battery conductance. Once per minute, typically, the test takes about 10 seconds and includes application of a load for about three seconds to remove any surface charge from the battery. At block 190, a check is made to determine if an extended charge is being performed. If an extended charge is being performed, control is passed to block 192 and a five second delay is introduced and control is then passed to block 196. If an extended charge is not being performed, control is passed to block 194 and, after a five second delay, a load is applied for ten seconds followed by a 25 second delay. This step can be used to remove any surface charge on the battery.

At block 196, microprocessor 34 measures the open circuit voltage of battery 8 and the cold cranking amps. Using, for example, battery conductance. If microprocessor 34 determines that the battery is good or that the battery is good and should be recharged, control is passed from block 198 to block 200. Alternatively, control is passed to block 202. At block 200, if the open circuit voltage of the battery is greater than or equal to 12.4 volts, control is passed to block 202. Alternatively, control is passed to block 204. At block 204, if an extended charge has been performed, control is passed to block the 202. If an extended charge has not been performed, the extended charge time is calculated at block 205 based upon battery conductance using a look up table and control is passed to block 188.

At block 202, microprocessor 34 determines an initial decision for the battery, either good or good and recharge. If the initial decision is negative, control is passed to block 206. Alternatively, control is passed to block 208 and, if the measured CCA is greater than or equal to 85% of the relative CCA, control is passed to block to 10. Alternatively, control is passed to block 212 and an operator is instructed to replace the battery because the battery CCA is poor. The procedure stops at block 214. Referring back to block 206, if the measured CCA is greater than or equal to 85% of the relative CCA, control is passed to block 210 and a good battery indication is provided. The procedure stops at block 216. Alternatively, block 206 passes control to block 218. Microprocessor 34 compares the measured CCA to the relative CCA and, if it is greater than or equal to 70%, control is passed to block 220 and a replace battery indication is provided. The procedure stops at block 222. Alternatively, block 218 passes control to block 212.

The steps illustrated in the flow chart of FIGS. 7A–C illustrate various example criteria and an example testing procedure. Of course, the present invention is not limited to the particular procedure set forth herein.

Another aspect of the present invention includes an I/O port or link 80 which is adapted to be coupled to an external device, such as an external battery tester, printer, storage device, automotive analysis device, etc. This may be a physical look, or, in one embodiment, this I/O link is through an infrared (IR), radio frequency (RF), or ultrasonic connection such that a physical link between the two units is not necessary. For example, the results from a previously performed battery test can be supplied to system 10 by a separate battery tester, whereby the initial condition of battery 8 is used during charging. Similarly, an external or separate device can communicate information such as the model number or type of battery being charged.

The present invention advantageously uses a Kelvin connection in which the electrical connection to the battery includes two connections for charging and two connections for a separate voltage measurement.

Additionally, during charging, the rate of increase of the voltage may be selectively monitored to determine charging efficiency and other characteristics of the battery.

One type of output that can be provided on output 40 includes various types of auditing codes such as those set forth in co-pending application Ser. No. 08/681,730, entitled "METHOD AND APPARATUS FOR AUDITING A BATTERY TEST", filed Jul. 29, 1996 which is commonly assigned with the present application. Example codes can include information related to results from various tests, the charging sequence followed by the tester, any inputs provided by a user, and raw data measurement, the battery condition, etc. Additional codes include the sequence code which can indicate the order in which tests were made on an individual battery a time code which indicates the date and time at which a test was made, or an identification code to indicate what service station or operator performed a test. The information can be used to audit the use of the charger to insure proper usage of the charger and prevent falsification of test results. This can reduce the occurrence of warranty fraud. The code typically provides some level of encryption to prevent falsification. The encrypted data can be output on the display or other data links set forth herein. Various parameters that can be included in the encrypted output include a measured dynamic parameter of the battery, temperature, any raw test data, any user input, geographic information, day, date or sequence information, vehicle identification such as a VIN of the vehicle, battery related information, the amount of charge or charging profile used to charge the battery, any decision made by the microprocessor while charging the battery, etc. The encryption algorithm can be a simple transposition cypher or can be a more complex algorithm such as a public key encryption or RSA technique. If an operator is expected to copy down the encrypted output, the encryption algorithm preferably provides an alpha numeric output.

The present invention can measure a dynamic parameter of a battery, that is one which is measured using a forcing function having an AC or time varying component. In general, although the formulas and techniques set forth herein discuss determination of conductance, the present invention may also be applied to impedance measurements, resistance measurements or admittance measurements of the storage battery or other combinations. Further, although a microprocessor and digital circuitry is disclosed herein, the present invention may also be implemented in analog circuitry. In general, various techniques for a measuring battery dynamic parameter such as conductance are show in a number of patents including, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 4,322,685, issued Mar. 30, 1982, entitled AUTOMATIC BATTERY ANALYZER INCLUDING APPARATUS FOR DETERMINING PRESENCE OF SINGLE BAD CELL; U.S. Pat. No. 5,343,380, issued Aug. 30, 1994, entitled "METHOD AND APPARATUS FOR SUPPRESSING TIME VARYING SIGNALS IN BATTERIES UNDERGOING CHARGING OR DISCHARGING"; U.S. Pat. No. 5,572,136, issued Nov. 5, 1996, entitled "ELECTRONIC BATTERY TESTER WITH AUTOMATIC COMPENSATION FOR LOW STATE-OF-CHARGE"; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE"; U.S. Pat. No. 5,585,728, issued Dec. 17, 1996, entitled "ELECTRONIC BATTERY TESTER WITH AUTOMATIC COMPENSATION FOR LOW STATE-OF-CHARGE"; U.S. Pat. No. 5,598,098, issued Jan. 28, 1997, entitled "ELECTRONIC BATTERY TESTER WITH VERY HIGH NOISE IMMUNITY"; U.S. Pat. No. 5,592,093, issued Jan. 7, 1997, entitled "ELECTRONIC BATTERY TESTING DEVICE LOOSE TERMINAL CONNECTION DETECTION VIA A COMPARISON CIRCUIT" U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ ADMITTANCE; and U.S. Pat. No. 6,051,976, issued Apr. 18, 2000, entitled METHOD AND APPARATUS FOR AUDITING A BATTERY TEST.

Although the present invention has been described with reference to preferred embodiments, workers skilled in the art will recognize that changes may be made in form and detail without departing from the spirit and scope of the invention. The various voltages and currents measured herein are set forth as alternating signals and their measurements may be through RMS values, peak-to-peak measurements, etc. However, other techniques may be employed and DC signals may also be monitored. In a typical battery charger, the AC component of the charging signal is related to the line frequency and thus, in the United States, is typically 60 Hz or 120 Hz. However, other frequencies may also be employed. Further, the charge signal may be a stepped DC signal and the voltage and current measurement circuitry responsive to step DC signals. In general, the invention determines battery and/or charging conditions based upon a ratio of charging voltage and charging current.

What is claimed is:

1. An apparatus for charging a storage battery, comprising:
   a first positive connector configured to couple to a positive terminal of the battery;
   a first negative connector configured to couple to a negative terminal of the battery;
   an electrical charging source configured to apply a charge signal to the battery through the first positive and negative connectors to thereby charge the battery;
   a microprocessor configured to test the battery, the microprocessor further configured to encrypt data related to the test and thereby provide an encrypted data audit code;
   an output coupled to the microprocessor configured to output the encrypted data audit code; and
   wherein the encrypted data audit code is provided to reduce falsification of test results and warranty fraud.

2. The apparatus of claim 1 wherein the test is a function of a measured dynamic parameter of the battery.

3. The apparatus of claim 2 wherein the encrypted data includes a measured dynamic parameter.

4. The apparatus of claim 1 including a second positive connector and a second negative connector, the connectors configured to provide a Kelvin connection to the battery.

5. The apparatus of claim 1 wherein the data comprises a result of the battery test.

6. The apparatus of claim 1 wherein the microprocessor determines battery conductance.

7. The apparatus of claim 1 including an electrical load configured to apply a load to the battery.

8. The apparatus of claim 1 wherein the data includes battery voltage.

9. The apparatus of claim 1 wherein the data includes information related to battery temperature.

10. The apparatus of claim 1 wherein the data includes information related to geographic location.

11. The apparatus of claim 1 wherein the data includes information related to a vehicle containing the battery.

12. The apparatus of claim 1 including a user input configured to receive an input from a user.

13. The apparatus of claim 1 wherein the data includes information related to the battery.

14. The apparatus of claim 13 wherein information related to the battery comprises rated battery Cold Cranking Amps (CCA).

15. The apparatus of claim 13 wherein the information related to the battery comprises battery type.

16. The apparatus of claim 13 wherein the information related to the battery comprises battery serial number.

17. The apparatus of claim 13 wherein the information related to the battery comprises battery model.

18. The apparatus of claim 13 wherein the information related to the battery comprises date of the manufacture of the battery.

19. The apparatus of claim 11 wherein the information related to the vehicle comprises the vehicle VIN code.

20. The apparatus of claim 1 wherein the data includes time information.

21. The apparatus of claim 1 wherein the data identifies the operator.

22. The apparatus of claim 1 wherein the data includes a digital signature.

23. The apparatus of claim 1 wherein the output comprises a printer output.

24. The apparatus of claim 1 wherein the output comprises a data transmission circuit.

25. The apparatus of claim 24 wherein the data transmission circuit comprises a modem.

26. The apparatus of claim 1 wherein the microprocessor determines battery impedance.

27. The apparatus of claim 1 wherein the microprocessor determines battery resistance.

28. The apparatus of claim 1 wherein the microprocessor determines battery admittance.

29. The apparatus of claim 1 wherein the first positive and first negative connectors carry a voltage signal and including second positive and second negative connectors which carry a current signal and the battery test is a function of the voltage and current signals.

30. The apparatus of claim 1 wherein the charge signal comprises an AC signal.

31. The apparatus of claim 4 including:
   voltage measurement circuitry coupled to the first positive electrical connector and first negative electrical connector to responsively provide a measured voltage output related to a voltage between the first positive and first negative connectors; and
   the microprocessor responsively provides the dynamic parameter as a function of the measured voltage output.

32. The apparatus of claim 1 wherein the charge signal from the charging source is responsive to the battery test to thereby control charging of the battery.

33. The apparatus of claim 1 wherein the output comprises a non-physical link.

34. The apparatus of claim 33 wherein the link comprises an infrared link.

35. The apparatus of claim 33 wherein the link comprises a radio frequency link.

36. The apparatus of claim 33 wherein the link comprises an ultrasonic link.

37. The apparatus of claim 1 wherein the encrypted data code includes a sequence code.

38. The apparatus of claim 1 wherein the encrypted data code includes information related to a charging sequence performed on the battery.

39. The apparatus of claim 1 wherein charging of the battery is suspended during the battery test.

40. The apparatus of claim 1 including an AC source configured to apply an AC signal to the battery during the battery test.

41. The apparatus of claim 40 wherein the AC source comprises a resistive load selectively coupled across the terminals of the battery.

42. The apparatus of claim 1 wherein the output comprise a display.

43. The apparatus of claim 1 wherein the encrypted output comprises alpha-numeric data.

44. A method of charging a storage battery, comprising:

applying an electrical charge signal from an electrical charge source to the battery;

measuring a parameter of the battery; and providing an encrypted output audit code as a function of the measured parameter; and wherein the encrypted output audit code is provided to reduce falsification of test results and warranty fraud.

45. The method of claim 44 wherein the parameter comprises a dynamic parameter.

46. The method of claim 45 wherein the dynamic parameter is measured through a Kelvin connection to the battery.

47. The method of claim 44 including determining a test result as a function of the dynamic parameter and wherein the encrypted output is a function of the test result.

48. The method of claim 44 wherein the data comprises a result of the battery test.

49. The method of claim 45 wherein the dynamic parameter comprises battery conductance.

50. The method of claim 44 including applying an electrical load to the battery.

51. The method of claim 44 wherein the encrypted output includes battery voltage.

52. The method of claim 44 wherein the encrypted output includes information related to battery temperature.

53. The method of claim 44 wherein the encrypted output includes information related to geographic location.

54. The method of claim 44 wherein the encrypted output includes information related to a vehicle containing the battery.

55. The method of claim 44 including receiving an input from a user.

56. The method of claim 44 wherein the encrypted output includes information related to the battery.

57. The method of claim 56 wherein information related to the battery comprises rated battery Cold Cranking Amps (CCA).

58. The method of claim 56 wherein the information related to the battery comprises battery type.

59. The method of claim 56 wherein the information related to the battery comprises battery serial number.

60. The method of claim 56 wherein the information related to the battery comprises battery model.

61. The method of claim 56 wherein the information related to the battery comprises date of the manufacture of the battery.

62. The method of claim 54 wherein the information related to the vehicle comprises the vehicle VIN code.

63. The method of claim 44 wherein the encrypted output includes time information.

64. The method of claim 44 wherein the encrypted output identifies the operator.

65. The method of claim 44 wherein the encrypted output includes a digital signature.

66. The method of claim 44 including printing the encrypted output.

67. The method of claim 44 wherein providing the encrypted output comprises transmitting encrypted data.

68. The method of claim 45 wherein the dynamic parameter comprises battery impedance.

69. The method of claim 45 wherein the dynamic parameter comprises battery resistance.

70. The method of claim 45 wherein the dynamic parameter comprises battery admittance.

71. The method of claim 44 wherein the charge signal comprises an AC signal.

72. The method of claim 44 wherein providing the encrypted output comprises providing the output over a non-physical link.

73. The method of claim 44 wherein the encrypted output includes a sequence code.

74. The method of claim 44 wherein the encrypted output includes information related to a charging sequence performed on the battery.

75. The method of claim 44 wherein applying the electrical charge signal to the battery is suspended during measurement of the battery parameter.

76. The method of claim 44 including applying an AC signal to the battery to measure the parameter.

77. The method of claim 76 wherein applying the AC signal comprises selectively couples a resistive load across terminals of the battery.

78. The method of claim 44 including responsively controlling the charge signal as a function of the measured parameter.

* * * * *

UNITED STATES PATENT AND TRADEMARK OFFICE
CERTIFICATE OF CORRECTION

PATENT NO. : 6,329,793 B1
DATED : December 11, 2001
INVENTOR(S) : Bertness et al It is certified that error appears in the above-identified patent and that said Letters Patent is hereby corrected as shown below:

<u>Column 12,</u>
Line 41, replace "couples" with -- coupling --.

Signed and Sealed this

Twenty-third Day of April, 2002

*Attest:*

*Attesting Officer*

JAMES E. ROGAN
*Director of the United States Patent and Trademark Office*